(12) United States Patent
Ali

(10) Patent No.: US 8,994,399 B2
(45) Date of Patent: Mar. 31, 2015

(54) TRANSMISSION LINE DRIVER WITH OUTPUT SWING CONTROL

(71) Applicant: Broadcom Corporation, Irvine, CA (US)

(72) Inventor: Tamer Ali, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 97 days.

(21) Appl. No.: 13/897,314

(22) Filed: May 17, 2013

(65) Prior Publication Data

US 2014/0320229 A1    Oct. 30, 2014

Related U.S. Application Data

(60) Provisional application No. 61/817,287, filed on Apr. 29, 2013.

(51) Int. Cl.
*H03K 17/16*     (2006.01)
*H03H 11/30*     (2006.01)
*H03K 19/0185*   (2006.01)
*H04L 25/02*     (2006.01)

(52) U.S. Cl.
CPC ....... *H03H 11/30* (2013.01); *H03K 19/018571* (2013.01); *H04L 25/0298* (2013.01)
USPC .............................................. 326/30; 326/21

(58) Field of Classification Search
CPC .................... H03K 19/018571; H04L 25/0298
USPC ...................................... 326/21, 26, 27, 30, 82
See application file for complete search history.

(56) References Cited

U.S. PATENT DOCUMENTS

| | | | | |
|---|---|---|---|---|
| 5,396,028 | A * | 3/1995 | Tomassetti .................. | 178/69 R |
| 6,888,370 | B1 * | 5/2005 | Luo et al. ........................ | 326/30 |
| 6,924,659 | B1 * | 8/2005 | Andrews et al. ................ | 326/30 |
| 7,102,390 | B2 * | 9/2006 | Frans et al. ..................... | 326/82 |
| 7,109,744 | B1 * | 9/2006 | Shumarayev et al. .......... | 326/30 |
| 7,750,666 | B2 * | 7/2010 | Zhang et al. .................... | 326/30 |
| 7,843,212 | B2 * | 11/2010 | Tanaka ............................ | 326/30 |
| 2012/0074983 | A1 * | 3/2012 | Nguyen .......................... | 326/30 |

OTHER PUBLICATIONS

John Poulton, et al., "A 14-mW 6.25-Gb/s Transceiver in 90-nm CMOS," IEEE Journal of Solid-State Circuits, Dec. 2007, pp. 2745-2757, vol. 42, No. 12.

* cited by examiner

*Primary Examiner* — Don Le
(74) *Attorney, Agent, or Firm* — McDermott Will & Emery LLP

(57) ABSTRACT

A transmission line driver including an output configured to have a load impedance is provided. The transmission line driver includes a pull-up circuit coupled in series with the output. The transmission line driver also includes a pull-down circuit coupled in series with the output. The transmission line driver includes a shunt circuit having an adjustable impedance. The shunt circuit is coupled in parallel to the output. The shunt circuit is coupled to the pull-up circuit and the pull-down circuit. The shunt circuit is configured to receive a shunt control signal to adjust the adjustable impedance to provide linear control of an output swing at the output.

20 Claims, 8 Drawing Sheets

TRANSMISSION LINE DRIVER WITH OUTPUT SWING CONTROL

CROSS-REFERENCE TO RELATED APPLICATIONS

The present application claims the benefit of U.S. Provisional Patent Application Ser. No. 61/817,287, titled "TRANSMISSION LINE DRIVER WITH OUTPUT SWING CONTROL," filed on Apr. 29, 2013, which is hereby incorporated by reference in its entirety for all purposes.

BACKGROUND

Transceiver systems including high-speed wire-line transceivers are used in various communication applications to provide high-speed chip-to-chip interconnects, broadband communications, and networking infrastructures. Voltage-mode drivers and current-mode logic drivers can be used to drive transmission lines between the transceiver systems. Current-mode logic drivers can provide linear stepping of the output swing but require more power than voltage-mode driver implementations. On the other hand, voltage-mode drivers may require more power and power management requirements than current-mode logic driver implementations.

SUMMARY

A system and/or circuit is provided for a transmission line driver with output swing control, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

Figure 1:
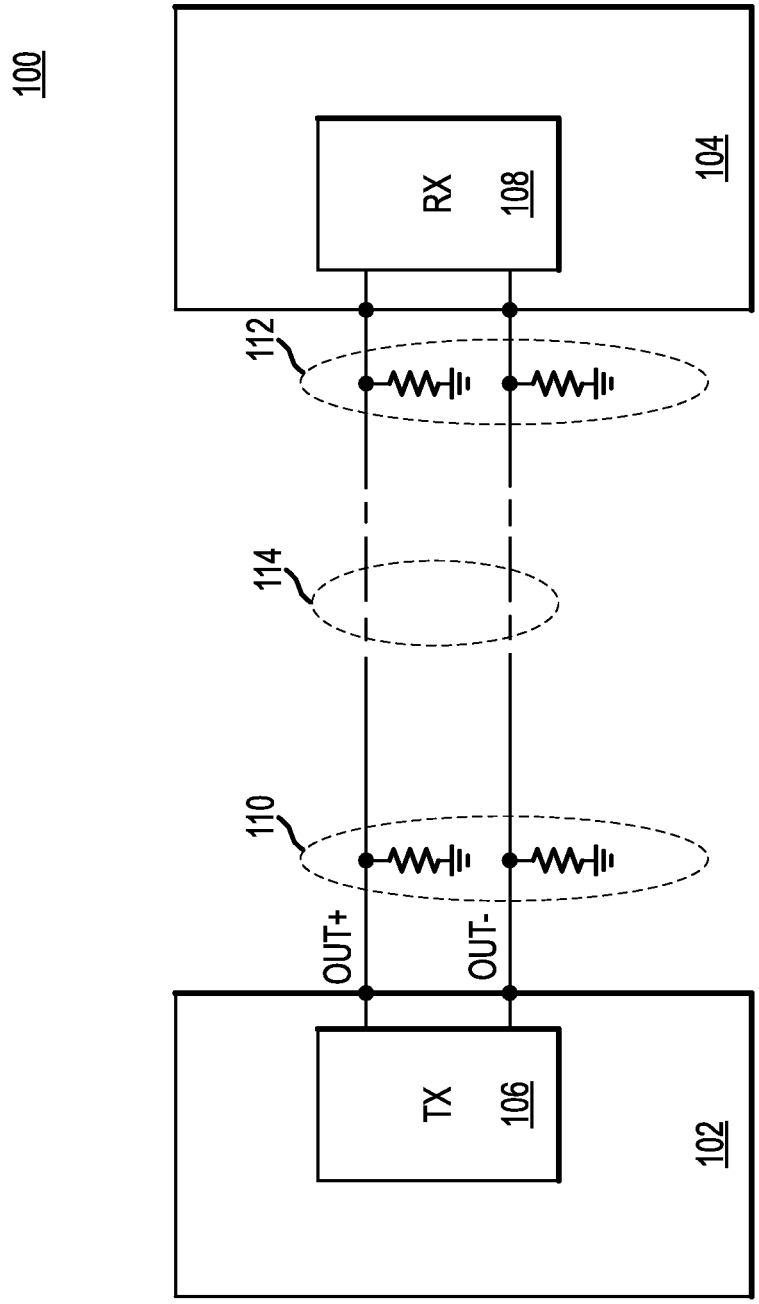
FIG. 1 is a block diagram illustrating an example of a transceiver system in accordance with one or more implementations.

FIG. 1 is a block diagram illustrating an example of a communication system 100 in accordance with one or more implementations. High-speed digital communication networks over copper and optical fiber are used in many network communication and digital storage implementations. Ethernet and Fibre Channel, among others, are widely used communication protocols and continue to evolve to respond to the increasing need for higher bandwidth in digital communication systems.

As shown in FIG. 1, communication system 100 includes transceiver 102 configured as a transmitter and transceiver 104 configured as a receiver. Transceiver 102 includes transmitter module 106 for transmitting via transmission line 114. Transceiver 104 includes receiver module 108 for receiving via transmission line 114.

Transceivers 102 and 104, which can include respective transmission line drivers, can be utilized in set-top boxes, cable modems, routers, computer interfaces, and other electronic devices to drive transmission lines, such as Ethernet transmission lines. By way of example, transmitter module 106 including a transmission line driver can be utilized in an Ethernet interface in a computer. To prevent return loss and signal distortion, for example, the transmission line driver in transmitter module 106 can be required to provide an output impedance that matches the characteristic impedance of transmission line 114.

In some aspects, a transmission line driver may be single-ended in an Ethernet implementation, and may be required to provide a 50.0 ohm output impedance to drive a 50.0 ohm load (e.g., load impedance 112) via a 50.0 ohm Ethernet cable coupled to an Ethernet port. Transmitter module 106 may be terminated by utilizing one or more termination resistors 110 to provide the required output impedance.

In one or more implementations, a transmission line driver, such as a voltage-mode driver, with differential outputs in transmitter module 106 can be passively terminated by utilizing two termination resistors coupled across the positive and negative outputs of the transmission line driver (not shown). In an Ethernet implementation, for example, each of the termination resistors can have a resistance of approximately 50.0 ohms to provide approximately 100.0 ohms across the differential positive and negative outputs of the transmission line driver.

Voltage-mode drivers can be used to drive transmission lines (e.g., transmission line 114) between transceivers 102 and 104. Calibration techniques for calibrating the voltage-mode drivers may utilize a low drop-out (LDO) regulator (not shown). Application of the LDO regulator can impact the voltage swing of a voltage supply. In this respect, the voltage-mode driver receives a regulated voltage from the LDO regulator with a voltage swing that is smaller than the voltage supply. By way of example, the LDO regulator receives a 1V supply voltage and provides a constant voltage output at 0.8V. In this respect, the voltage-mode driver cannot swing rail-torail. As such, a higher voltage supply becomes necessary to compensate for the reduction in voltage swing, thus resulting in additional power management requirements for the voltage-mode driver. The requirement to increase the voltage supply can become difficult for transmission lines that conform to a standard protocol and/or design requirements.

Voltage-mode drivers also may require relatively large switches to minimize variations in the voltage swing, which may cause the power consumption to increase significantly. Given that transmission line 114 can experience attenuation, crosstalk and reflections, the calibration techniques may mitigate these unwanted effects notwithstanding significant power, area and output capacitance penalties.

Moreover, transmission line 114 may require linear stepping of the voltage swing pursuant to certain transmission standards. The output swing stepping by the voltage-mode drivers using the calibration techniques may not be acceptable to satisfy the transmission standards. In this respect, current-mode logic drivers may be implemented despite significant power consumption compared to voltage-mode driver implementations.

By way of illustration without limiting the scope of the subject disclosure, transceiver 102 may be configured as a transmission line driver with output swing control. Transceiver 102 may be composed of multiple driver slices, each having adjustable impedances to maintain matching of load impedance 112. Transceiver 102 may have driver slices terminated in series with load impedance 112 (sometimes referred to as a series slice) to adjust the output swing amplitude while configured to provide linear stepping using driver slices coupled in parallel to load impedance 112 (sometimes referred to as a shunt slice). The impedance of the series slices are adjustable in the foreground using an in-situ low-dropout regulator included in each series slice. Each series slice may be configured to receive a supply voltage directly, thus allowing the driver slice to swing rail-to-rail. Transceiver 102 configured as a voltage-mode driver implementation can avoid the aforementioned shortcomings of using an LDO regulator at the expense of a smaller voltage swing and also configured to achieve linear stepping of the output swing with significantly less power consumption than a current-mode logic driver implementation.

In some implementations, a transmission line driver including an output configured to have load impedance 112 may be provided in transmitter module 106. The transmission line driver may include a pull-up circuit coupled in series with the output. The transmission line driver also may include a pull-down circuit coupled in series with the output. The transmission line driver may include a shunt circuit having an adjustable impedance. The shunt circuit may be coupled in parallel to the output. The shunt circuit also may be coupled to the pull-up circuit and the pull-down circuit. The shunt circuit may be configured to receive a shunt control signal to adjust the adjustable impedance to provide linear control of an output swing at the output.

The transmission line driver in accordance with one or more implementations of the subject technology can provide significant area and power savings compared to other line driver approaches. The transmission line driver allows a smaller transmitter implementation than other line driver implementations, thus simplifying input/output (I/O) design and reduction in system-on-chip (SOC) area. With the reduction in SOC area, cost savings can be realized.

In some aspects, transceivers 102 and 104 may be configured as optical-based transceivers. An optical-based transceiver, for example, includes various functional components such as clock data recovery, clock multiplication, serialization/de-serialization, encoding/decoding, electrical/optical conversion, descrambling, media access control, controlling, and data storage. Many of the functional components can be implemented in separate integrated circuit chips or dies.

Communication system 100 can be an electronic device such as a switch, router, Ethernet card, mobile telephone, personal digital assistant, tablet computer, game console, personal computer, laptop computer, or other electronic device that performs one or more functions that include communication of voice and/or data via transmission line 114 (sometimes referred to as a wire-line connection).

In one or more implementations, transmission line 114 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary.

In some aspects, transmission line 114 may include one or more of a twisted-pair, coaxial cable, a bus structure, or fiber optics. By way of illustration without limiting the scope of the subject disclosure, if transmission line 114 includes one or more twisted pairs, communication via the twisted pair(s) would be in accordance with one or more twisted pair signaling protocols (e.g., Cat 5 (10 Base-TX & 100 Base-T), Cat 5e (10 Base-TX & 100 Base-T), Cat 6a (10 GBase-T), EIA-485, secure transfer protocol, 1.430, Controller Area Network, Sony/Philips Digital Interconnect Format, etc.). By way of another example, if transmission line 114 includes one or more bus structures (e.g., an address bus, a control bus, and/or a data bus), communication via the bus structure would be in accordance with one or more computer type bus protocols (e.g., universal serial bus, peripheral component interconnect (PCI), PCI express, FireWire, S.-100 bus, Unibus, VAXBI, MBus, STD Bus, SMBUS, Q-Bus, ISA, Zorro, CAMAC, FASTBUS, LPC, Precision Bus, EISA, VME, VIX, NuBus, TURBOchannel, MCA, SBus, VLB, PXI, GSC bus, CoreConnect, InfiniBand, UPA, PCI-X, AGP, QuickPath, HyperTransport, PC Card, ExpressCard, ST-506, ESDI, SMD, Parallel ATA, DMA, SSA, HIPPI, IPI, MSC, Serial ATA, SCSI, SCSI parallel, SCSI Serial, Fibre Channel, iSCSI, ATAoE, MIDI, MultiBus, RS-232, DMX512-A, IEEE-488, EIA/RS-422, IEEE-1284, UNI/O, ACCESS.bus, 1-Wire, I2C, SPI, Ethernet Passive Optical Network (EPON), XFP).

Figure 2A:
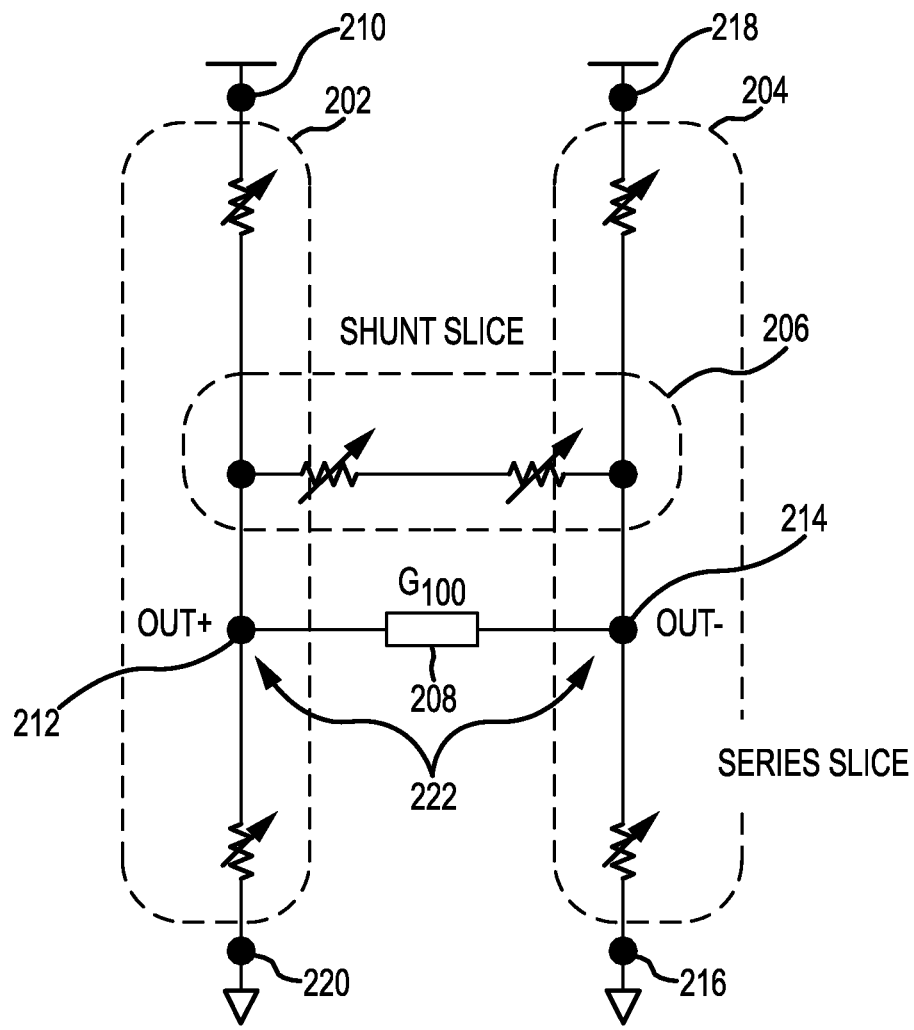
FIG. 2A is a schematic diagram illustrating an example of a transmission line driver with a series slice and shunt slice in accordance with one or more implementations.

FIG. 2A is a schematic diagram illustrating an example of a transmission line driver 200 with a series slice and a shunt slice in accordance with one or more implementations. As shown in FIG. 2A, transmission line driver 200 includes output 222 configured to have load impedance 208. Here, output 222 is denoted as a differential output (e.g., Out+, Out−). In one or more aspects, output 222 may be single-ended. As shown in FIG. 2A, output 222 is located between nodes 212 and 214. The load impedance may represent the termination at a receiver. Here, the load impedance is configured as, for example, 100 ohms to represent the summation of 50 ohms on each differential transmission line.

In some aspects, transmission line driver 200 includes a series slice including two portions 202 and 204 and shunt slice 206. A series slice may refer to a termination impedance that is connected (or coupled) in series with output 222. A shunt slice may refer to a termination impedance that is connected (or coupled) in parallel to output 222.

Series slice 202 and 204 may include a pull-up circuit coupled in series with output 222. In some aspects, the pull-up circuit may be coupled to a voltage supply (e.g., $V_{DD}$). In one or more aspects, the pull-up circuits in series slice 202 and

204 may be coupled to different voltage supplies (e.g., $V_{DD}$, $V_{SS}$). In addition, series slice 202 and 204 may include a pull-down circuit coupled in series with output 222. In some aspects, the pull-down circuit is coupled to ground. In this respect, series slice 202 and 204 may be coupled to a common ground. In some aspects, series slice portion 202 is configured to receive a first common input (e.g., In−). In turn, series slice portion 204 may be configured to receive a second common input (e.g., In+).

Shunt slice 206 may include a shunt circuit that has adjustable impedances. As noted above, the shunt circuit may be coupled in parallel to output 222. As shown in FIG. 2A, the shunt circuit may be coupled to the pull-up circuit of series slice 202 and the pull-down circuit of series slice 204. In some aspects, the shunt circuit may be coupled to the pull-up circuit of series slice 204 and the pull-down circuit of series slice 202. The shunt circuit may be configured to receive a shunt control signal from a calibration circuit (not shown) to adjust the adjustable impedances of the shunt circuit to provide linear control of an output swing at output 222. Each respective adjustable impedance may be equal to one another in one or more implementations. In some aspects, the shunt control signal may include a pre-emphasis signal.

During operation, only some portions of a series slice may be conducting current at a time. In one situation, a path including nodes 210, 212, 214 and 216 may conduct current in one direction. In another situation, a path including nodes 218, 214, 212 and 220 may conduct current. Stated in another way, a portion of series slice 202 and 204 may conduct current from node 210 to node 212, then to node 216 via node 214 to provide a voltage swing at output 222. Alternatively, a portion of series slice 202 and 204 may conduct current from node 218 to node 214, then to node 220 via node 212 to provide a voltage swing at output 222.

Figure 2B:
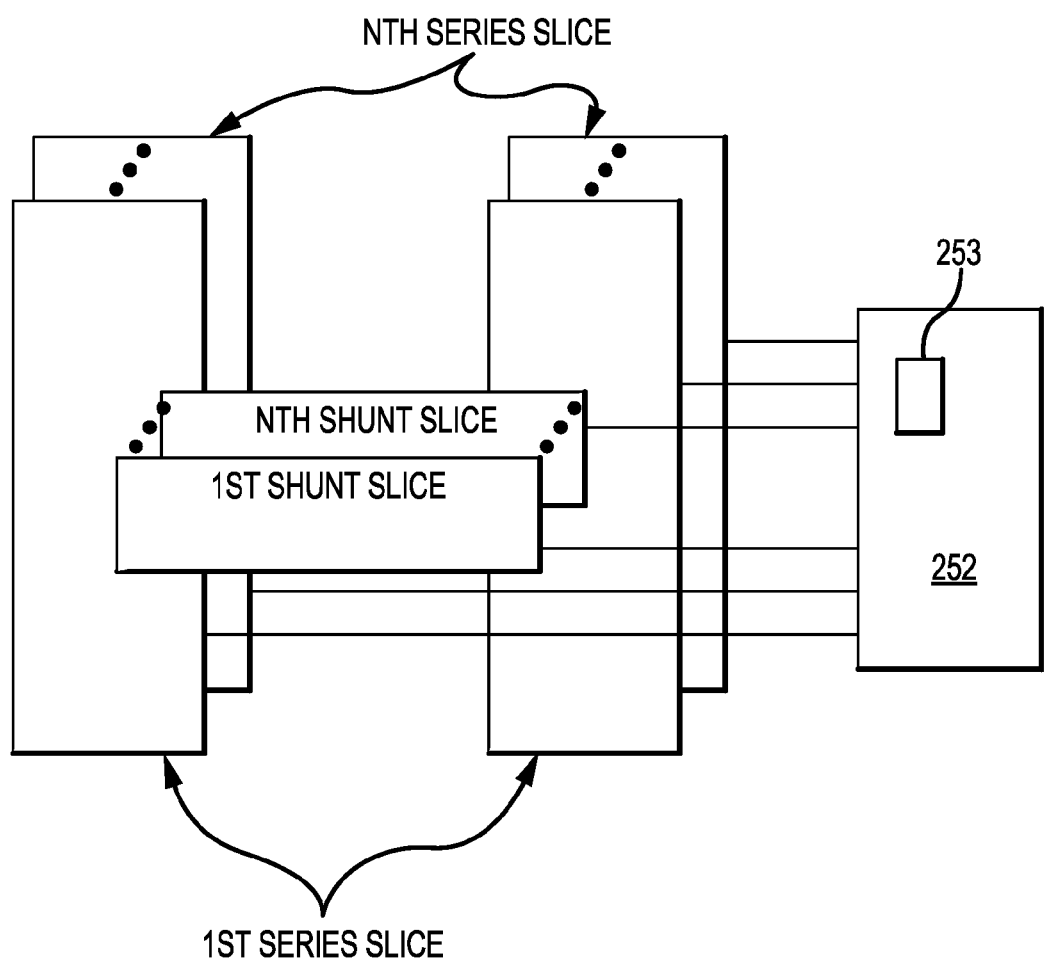
FIG. 2B is a schematic diagram illustrating an example of a transmission line driver with parallel series slices and parallel shunt slices in accordance with one or more implementations.

FIG. 2B is a schematic diagram illustrating an example of transmission line driver 250 with parallel series slices and parallel shunt slices in accordance with one or more implementations. While transmission line driver 200 of FIG. 2A shows one series slice and one shunt slice, FIG. 2B illustrates a plurality of series slices and a plurality of shunt slices.

Transmission line driver 250 may include a differential input and differential output that is configured to have a load impedance. As shown in FIG. 2B, N series slices may be coupled in parallel to one another, where N is a positive integer. The N series slices are coupled to the differential output. N series slices may refer to N number of series slices.

Each of the N series slices may include a first adjustable impedance coupled in series with the differential output. Each of the N series slices also may include a second adjustable impedance coupled in series with the differential output. The first and second adjustable impedances are adjustable based on the load impedance. In some aspects, each of the first and second adjustable impedances is equivalent to $R_{LOAD}*N$, where $R_{LOAD}$ is the load impedance.

Transmission line driver 250 includes N shunt slices that are coupled to the differential output. Each of the N shunt slices may include a third adjustable impedance. Each of the N shunt slices also may include a fourth adjustable impedance that is coupled in series with the third adjustable impedance. The third and fourth adjustable impedances together are coupled in parallel to the differential output. N shunt slices may refer to N number of shunt slices.

Transmission line driver 250 may include selection circuit 252 that is coupled to each of the series slices and each of the shunt slides. Selection circuit 252 is configured to select N−m shunt slices of the N shunt slices when m series slices of the N series slices are selected, where m is an integer number that is less than N. In one or more aspects, selection circuit 252 may include pass gates 253 coupled to respective ones of the N series slices. Selection circuit 252 may be configured to receive the first and second control voltages and multiple enable signals to generate series slice select signals. The series slice select signals may be based on the first or second control voltages and respective ones of the plurality of enable signals.

In some aspects, transmission line driver 250 may include a first calibration circuit (e.g., 422 in FIG. 4) that is coupled to the N series slices. The first calibration circuit may be configured to bias the first adjustable impedance with a first control voltage. Transmission line driver 250 also may include a second calibration circuit (e.g., 442 in FIG. 4) that is coupled to the N series slices. The second calibration circuit may be configured to bias the second adjustable impedance with a second control voltage. Transmission line driver 250 also may include a third calibration circuit (e.g., 350 in FIG. 3) that is coupled to the N shunt slices. In some aspects, there is one shunt calibration circuit for N shunt slices. The third calibration circuit may be configured to bias the third and fourth adjustable impedances with a third control voltage. In some implementations, each of the first, second, third and fourth adjustable impedances may be configured to have a resistance value that is less than or equal to $N*R_{LOAD}$, where $R_{LOAD}$ is the load impedance.

Figure 2C:
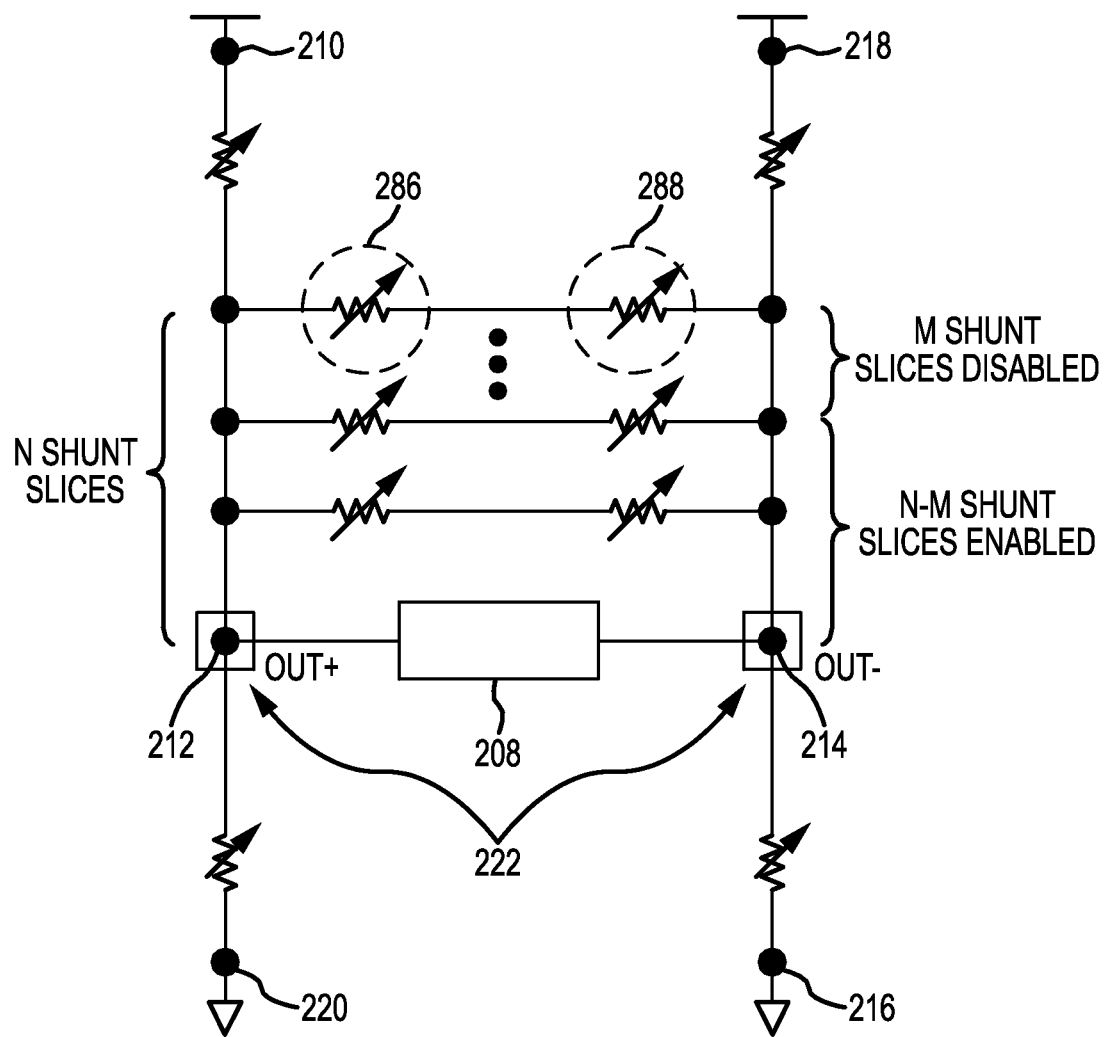
FIG. 2C is a schematic diagram illustrating an example of a transmission line driver with parallel shunt slices in accordance with one or more implementations.

FIG. 2C is a schematic diagram illustrating an example of transmission line driver 275 with parallel shunt slices in accordance with one or more implementations. Transmission line driver 275 is substantially similar to transmission line driver 200 as described above, therefore, only differences are to be described in further detail.

As shown in FIG. 2C, transmission line driver 275 is implemented with shunt slices. Transmission line driver 275 includes differential output 222 configured to have a load impedance (e.g., 100 ohms representative of receiver termination). Transmission line driver 275 may include a pull-up circuit that is coupled in series with differential output 222. Pull-up circuit may be located between nodes 210 and 212 for a first transmission line. Pull-up circuit also may be located between nodes 218 and 214 for a second transmission line. Transmission line driver 275 also may include a pull-down circuit coupled in series with differential output 222. Pull-down circuit may be located between nodes 212 and 220 for the first transmission line. In addition, pull-down circuit may be located between nodes 214 and 216 for the second transmission line. Here, pull-up and pull-down circuits may include variable resistors.

Transmission line driver 275 includes N shunt slices coupled in parallel to one another, where N is a positive integer. The shunt slices are coupled at differential output 222. Each of the shunt slices includes first resistor 286 and second resistor 288 coupled in series with first resistor 286.

In some aspects, transmission line drive 275 may include a selection circuit (not shown) that is coupled to the shunt slices. The selection circuit may be configured to provide shunt slice select signals to select respective ones of the shunt slices. The third device of the respective ones of the shunt slices may be configured to receive a respective one of the shunt slice select signals. In some aspects, a shunt slice select signal may be a pre-emphasis signal.

As shown in FIG. 2C, m shunt slices of the N shunt slices may be disabled when m series slices are enabled. On the other hand, N−m shunt slices may be enabled when N−m series slices are disabled. Here, m shunt slices may refer to m number of shunt slices, m series slices may refer to m number of series slices, where m is an integer number selected. In some implementations, the output swing that can be realized across nodes 212 and 214 may depend on the number of shunt slices enabled (or selected). By way of illustration, 30 series slices and 30 shunt slices can be implemented in transmission line driver 275. During operation, 15 series slices of the 30 available may be selected to provide 500 mV peak-to-peak with a 1V voltage supply. 15 shunt slices of the 30 available are enabled so that N number of total slices with a 50 ohm termination, for example, can still be observed between nodes 212 and 214. Moreover, 15 shunt slices are selected to maintain a linear representation of the output swing at differential output 222. Note that when current conducts from nodes 210 to 216 via nodes 212 and 214, 250 mV can be realized in this direction. As such, obtaining voltage swings in both directions (e.g., from node 212 to node 216 via nodes 212 and 214, from node 218 to node 220 via nodes 212 and 214) can achieve the desired output swing setting (e.g., 2*250 mV or 500 mV).

By way of illustration without limiting the scope of the subject disclosure, 100 ohms is assumed between nodes 210 and 212. Similarly, between nodes 214 and 216, 100 ohms is assumed. Load impedance 208 is 100 ohms. An equivalent impedance of 200 ohms is assumed across nodes 212 and 214 when 15 shunt slices are selected. In this respect, the total impedance including load impedance 208 realized across nodes 212 and 214 becomes 66.67 ohms (e.g., 1/100+1/200). At node 212, the voltage observed may be 625 mV based on a ratio of 167 ohms, between nodes 210 and 214 via node 212, to 267 total ohms (e.g., 167/267). At node 214, the voltage observed may be 375 mV (e.g., 67/267). The difference in voltage across nodes 212 and 214 is 250 mV. The shunt slices help maintain the output impedance of transmission line driver 275 fixed since the impedance may increase when series slices alone are removed (or disabled).

Figure 2D:
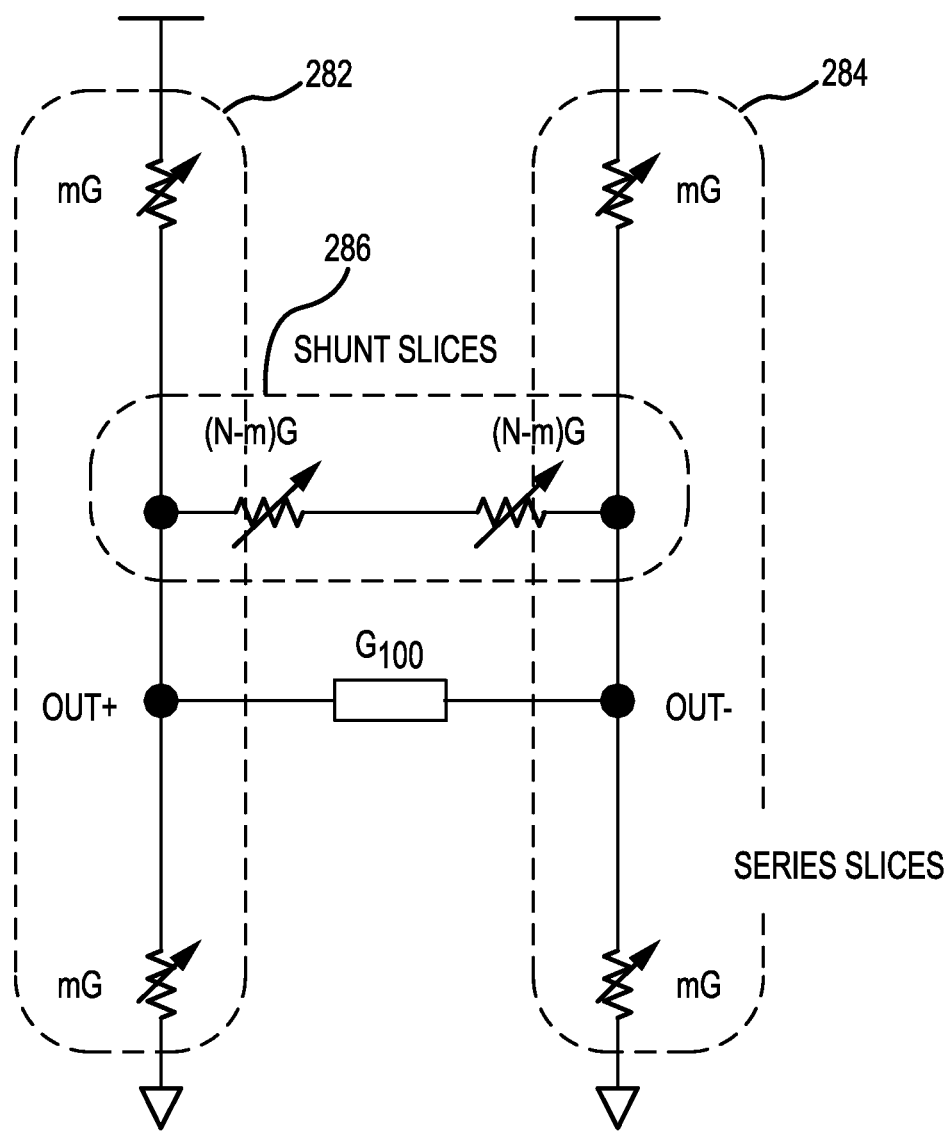
FIG. 2D is a schematic diagram illustrating an example of a transmission line driver with m series slices and N−m shunt slices selected and operating in accordance with one or more implementations.

FIG. 2D is a schematic diagram illustrating an example of transmission line driver 290 with m series slices and N−m shunt slices selected and operating in accordance with one or more implementations. As shown in FIG. 2D, N−m shunt slices 286 are enabled when m series slices 282 and 284 are enabled. Here, N−m shunt slices may refer to N−m number of shunt slices, m series slices may refer to m number of series slices, where m is an integer number selected. Each series slice may have a conductance of G. As such, for m number of series slices selected, the conductance for m number of series slices is mG. Similarly, for N−m number of shunt slices selected, the conductance for N−m number of shunt slices is (N−m)G. In this respect, the differential output of transmission line driver 290 may have an output voltage swing that is given by $$V_{swing} = \frac{mG}{2NG} V_{DD},$$

where $V_{swing}$ is the output voltage swing, G is the conductance value of each of the N series slices and N shunt slices, and $V_{DD}$ is a supply voltage configured to be applied to the N series slices. While driver 290 may include a total of N number of series slices and a total of N number of shunt slices, when m number of series slices is selected, N−m number of shunt slices are selected such that the total number of slices selected is N (i.e., m+(N−m)=N). The total number of slices selected includes the total number of series slices selected and the total number of shunt slices selected.

Figure 3:
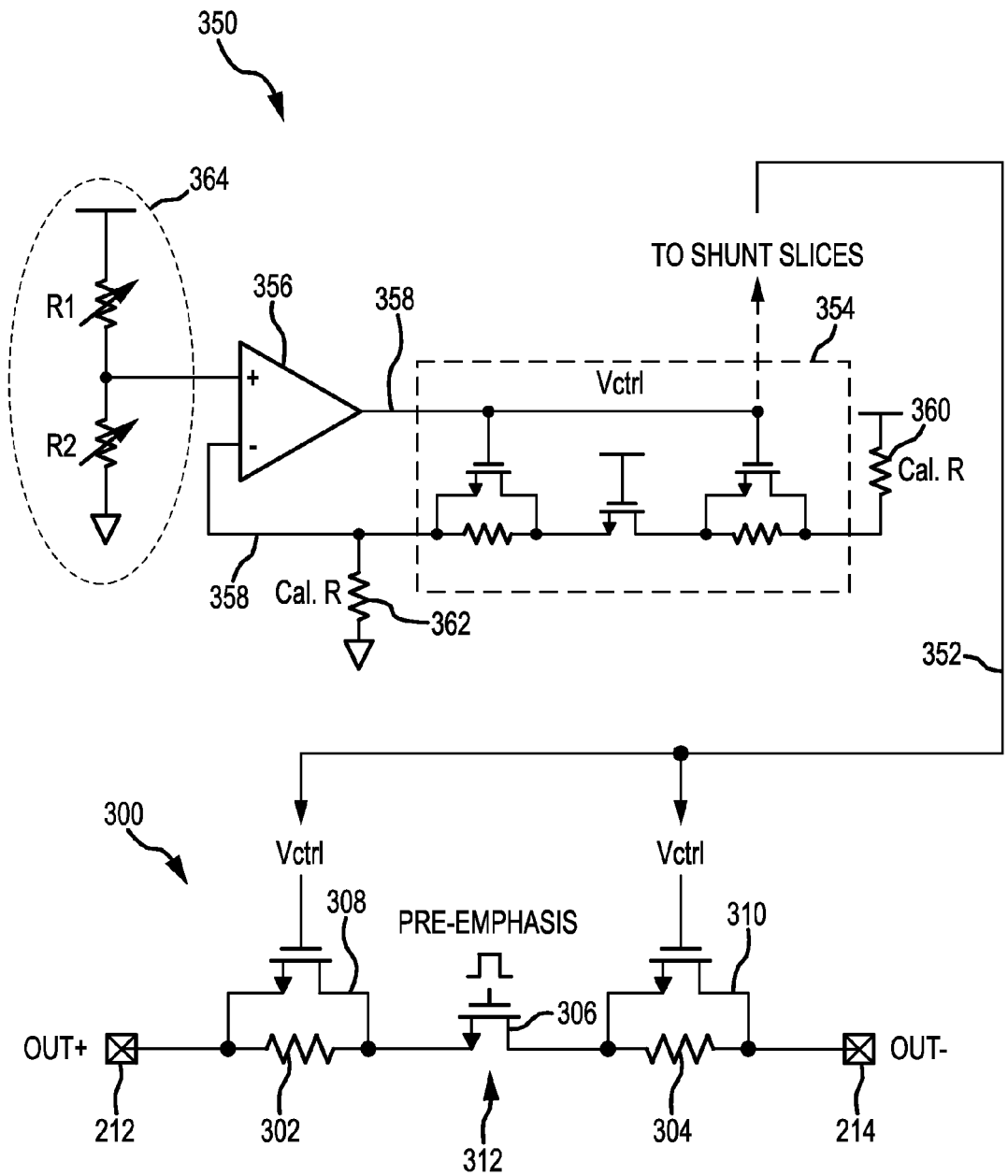
FIG. 3 is a schematic diagram illustrating an example of a shunt slice and a calibration circuit in accordance with one or more implementations.

FIG. 3 is a schematic diagram illustrating an example of shunt slice 300 and calibration circuit 350 in accordance with one or more implementations. As described above, a transmission line driver may include an output configured to have a load impedance. The transmission line driver may include a pull-up circuit coupled in series with the output and a pull-down circuit coupled in series with the output. The transmission line driver may include shunt circuit 300 (sometimes referred to as a shunt slice) having an adjustable impedance. The shunt circuit may be coupled in parallel to the output. The output is located between nodes 212 and 214. Shunt circuit 300 may be coupled to the pull-up circuit and the pull-down circuit. Shunt circuit may be configured to receive a shunt control signal to adjust the adjustable impedance to provide linear control of an output swing at the output.

Shunt circuit 300 includes first resistor 302 and second resistor 304 coupled in series with first resistor 302. Device 306 may be coupled between first and second resistors 302 and 304. Device 306 may be configured to receive a pre-emphasis signal to enable shunt circuit 300. In this respect, the power may drop linearly with increasing pre-emphasis steps. In some implementations, the pre-emphasis signal may include signals corresponding to different steps of the output swing. In some aspects, first and second resistors 302 and 304 have substantially equivalent resistance values. By way of illustration, first resistor 302 may be 1.5 k ohms and second resistor may be 1.5 k ohms. Note that the values of first and second resistors 302 and 304 may be different than the configuration described herein.

Shunt circuit 300 also may include device 308 coupled in parallel to first resistor 302. Shunt circuit 300 also may include device 310 coupled in parallel to second resistor 304. Devices 308 and 310 are configured to receive the shunt control signal, in which the shunt control signal is configured to control a gate voltage of devices 308 and 310. Depending on implementation, devices 308 and 310 may be n-channel transistors. Similarly, device 306 may be an n-channel transistor. In some aspects, devices 306, 308 and 310 may be p-channel transistors.

In some aspects, shunt circuit 300 includes a virtual ground 312 formed at a location between devices 308 and 310. In this respect, virtual ground 312 provides a voltage divider involving first resistor 302 and second resistor 304. As such, the output termination of the transmission line driver can be kept fixed since shunt circuit 300 compensates for any disabled series slice implementation.

Shunt circuit 300 may include multiple shunt slices coupled in parallel. Each of the shunt slices may have a respective adjustable impedance. The shunt slices may be configured to be individually selected by a respective shunt slice select signal.

In some aspects, a sum of the impedance of the first device, the impedance of the second device and an impedance of the third device is less than or equal to $N*R_{LOAD}$, where $R_{LOAD}$ is the load impedance, and N is the total number of driver slices selected, where the driver slices selected include the total number of series slices selected and the total number of shunt slices selected. In this respect, the subject disclosure provides for a size of the third device that is as small as possible. By way of illustration without limiting the scope of the subject disclosure, if N=30 and the load impedance is 50 ohms, then the desired matching termination for all 30 driver slices is 30*(50 ohms) or 1.5 k ohms. As such, the sum of the impedances cannot exceed 1.5 k ohms. Decreasing the size of the third device provides for a decrease in switching power since the amount of capacitance seen at the device can decrease proportionately.

Calibration circuit 350 includes amplifier 356 having a feedback loop that connects an output of the amplifier to an input of the amplifier. Calibration circuit 350 also includes shunt slice replica 354 that is a replica of shunt circuit 300. Shunt slice replica 354 is coupled to feedback loop 358. Calibration circuit 350 includes first calibration resistor 360 coupled to a first node of shunt slice replica 354 and a voltage supply. Calibration circuit 350 also includes second calibration resistor 362 coupled to a second node of shunt slice replica 354 and ground. Shunt slice replica 354 is configured to be biased by amplifier 356 until first and second calibration resistors 360 and 362 reach an impedance that matches the load impedance.

As shown in FIG. 3, an input of amplifier 356 is coupled to voltage divider circuit 364 that is configured to provide the input with a bias voltage based on a reference output swing. In some aspects, the voltage divider circuit 364 is coupled to a positive input of amplifier 356. Voltage divider circuit 364 may represent the reference output swing. Voltage divider circuit 364 may be composed of R1 and R2 coupled in series, where R1 and R2 are fixed during the foreground calibration. In some aspects, R1 and R2 are different. By way of illustration without limiting the scope of the subject disclosure, R1 may be 6.25 k ohms and R2 may be 3.75 k ohms. In this respect, the peak-to-peak voltage swing that can be observed between nodes 212 and 214 (e.g., differential output 222) is 500 mV, where 250 mV pertains to a positive swing and 250 mV pertains to a negative swing.

In some implementations, the components of calibration circuit 350 may be replaced with a 1-bit sigma-delta digital-to-analog converter to generate the analog calibration voltage based on digital calibration.

Figure 4:
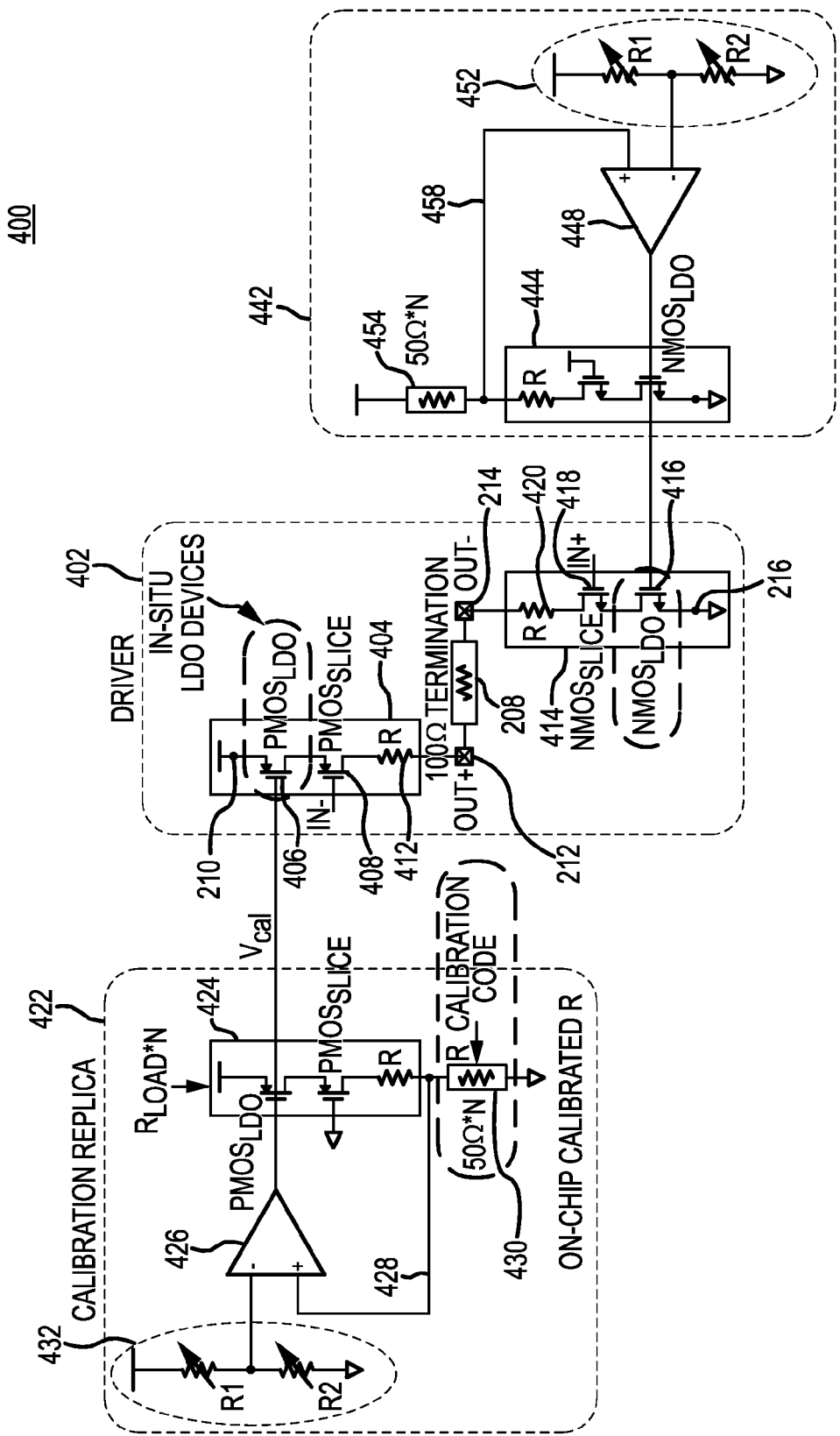
FIG. 4 is a schematic diagram illustrating an example of a series slice driver and calibration circuits in accordance with one or more implementations.

FIG. 4 is a schematic diagram illustrating an example of series slice driver 402 and calibration circuits 422 and 442 in accordance with one or more implementations. As shown in FIG. 4, series slice driver 402 includes pull-up circuit 404 and pull-down circuit 414. Pull-up circuit 404 includes first device 406 configured to receive a first series control signal (e.g., Vcal). First device 406 is coupled to a voltage supply (e.g., VDD). Pull-up circuit 406 also includes second device 408 that is configured to receive a first data input (e.g., In−). Second device 408 is coupled to first device 408 and first node 212 of the output.

In some aspects, pull-down circuit 414 includes third device 416 configured to receive a second series control signal (e.g., Vcal). Third device 416 is coupled to ground. Pull-down circuit 414 also includes fourth device 418 that is configured to receive a second data input (e.g., In+). Fourth device 418 is coupled to third device 416 and second node 214 of the output. Pull-up circuit 404 and pull-down circuit 414 are configured to provide a rail-to-rail voltage at the output based on the first and second series control signals.

In some aspects, first and second devices 406 and 408 are p-channel transistors and third and fourth devices 416 and 418 are n-channel transistors. In one or more implementations, first and third devices 406 and 416 are configured to operate as in-situ low-dropout voltage regulators.

As described above, series slice 202 of FIG. 2A is configured to receive a first common input (e.g., In−). In turn, series slice 204 of FIG. 2A may be configured to receive a second common input (e.g., In+). In this respect, pull-up circuit 404 will become active when In− is zero. Similarly, pull-down circuit 414 will become active when In+ is one. As such, a path is formed from node 210 to node 216 via nodes 212 and 214. On the other hand, current may conduct in the other direction (e.g., a path formed from node 218 to node 220 via nodes 212 and 214) when In− is one and In+ is zero since the other legs (or portions) of series slice driver 402 (not shown) become active.

Calibration circuits 422 and 442 are substantially similar to calibration circuit 350 as described above, therefore, only differences are to be described in further detail. Calibration circuit 422 is coupled to pull-up circuit 404. Calibration circuit 422 is configured to provide a first calibration voltage to pull-up circuit 404 to match an impedance of pull-up circuit 404 with load impedance 208. Calibration circuit 442 is coupled to pull-down circuit 414. Calibration circuit 442 is configured to provide a second calibration voltage to pull-down circuit 414 to match an impedance of pull-down circuit 414 with load impedance 208.

Calibration circuit 422 includes series slice replica 424, amplifier 426, feedback loop 428, calibration resistor 430, and voltage divider circuit 432. In comparison to calibration circuit 350 of FIG. 3, series slice replica 424 is configured to mimic pull-up circuit 404 of series slice driver 402. In doing so, the required matching impedance as well as a desired output swing can be provided via the first series control signal (e.g., Vcal) to pull-up circuit 404. In some aspects, series slice replica 424 also contains a p-channel transistor acting as an in-situ LDO regulator. The impedance realized in series slice replica 424 is $R_{LOAD}*N$. Voltage divider circuit 432 includes R1 and R2. In some aspects, R1 and R2 are different resistor values that can be predefined to form a desired output swing setting. Calibration resistor 430 is configured to have an impedance equivalent to $R_{LOAD}*N$. In operation, amplifier 426 may be configured to sense the voltage in series slice replica 424 and adjust the first series control signal such that calibration resistor 430 reaches the required matching impedance.

Calibration circuit 442 may be configured to calibrate pull-down circuit 414. Calibration circuit 442 includes series slice replica 444, amplifier 448, feedback loop 450, voltage divider circuit 452 and calibration resistor 454. In some aspects, series slice replica 424 also contains an n-channel transistor acting as an in-situ LDO regulator. The impedance realized in series slice replica 444 is $R_{LOAD}*N$. Calibration resistor 454 is configured to have an impedance equivalent to $R_{LOAD}*N$. In some implementations, the components of calibration circuits 422 and 442 may be replaced with a 1-bit sigma-delta digital-to-analog converter to generate the analog calibration voltage (e.g., series control signal) based on digital calibration.

Figure 5:
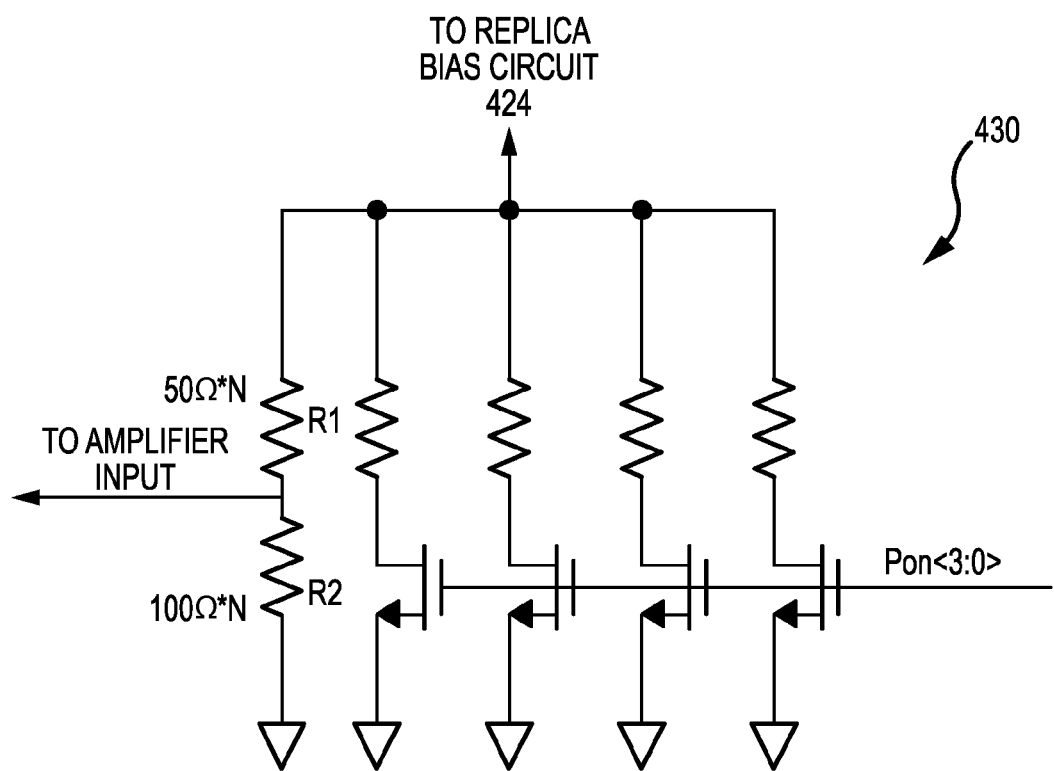
FIG. 5 is a schematic diagram illustrating an example of a calibration impedance circuit included in the foreground calibration of FIG. 3 in accordance with one or more implementations.

FIG. 5 is a schematic diagram illustrating an example of calibration resistor 430 included in the foreground calibration of FIG. 3 in accordance with one or more implementations. As shown in FIG. 5, calibration resistor 430 may be adjusted to match the load impedance to reduce the likelihood of reflections on the transmission lines. Calibration resistor 430 may include multiple calibration legs coupled in parallel, each with a switch coupled in series with a resistor. The gate node of each switch can be controlled via a selection bus signal (e.g., Pon<3:0>) to individually select the switches. Calibration resistor 430 also may include a voltage divider leg in parallel to the remaining calibration legs, where R1 is equivalent to N*50 ohms and R2 is equivalent to N*100 ohms. The output of the voltage divider leg may be output to the positive input of amplifier 426, for example.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

As used herein, the terms, chip, die, integrated circuit, semiconductor device, and microelectronic device, are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium can be all related. The related terms listed above, can be interchangeable, and appear in order from specific to general. In the field of electronics, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to as polysilicon, or sometimes more simply as poly. It is noted that polysilicon is commonly used to form the gate electrode of a FET. An alternative use of polysilicon is as a sacrificial gate electrode that is removed and replaced with a metal gate, or any other suitable material, during the manufacturing process.

As used herein, the term field effect transistor (FET) may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET). An n-channel FET is referred to herein as an NFET. A p-channel FET is referred to herein as a PFET. FETs that are formed in a bulk substrate, such as a silicon wafer, have four terminals, namely gate, drain, source and body. FETs can be formed in SOI substrates, and other various substrates with differential material types.

As used herein, "gate" may refer to an insulated gate terminal of a FET. The physical structure of the gate terminal is referred to as a gate electrode. In terms of the layout of an integrated circuit, the gate electrode is the logical AND of the polysilicon layer with the layer representing an active portion of the semiconductor surface.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals, these terminals can be simply referred to as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g. glass), or combinations of semiconducting and non-semiconducting materials (e.g., silicon-on-insulator (SOI)). In the semiconductor industry, a bulk silicon wafer is a very commonly used substrate for the manufacture of integrated circuits.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit implementations.

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. Such disclosure may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A transmission line driver comprising:
an output configured to have a load impedance;
a pull-up circuit coupled in series with the output;
a pull-down circuit coupled in series with the output; and
a shunt circuit having an adjustable impedance, the shunt circuit coupled in parallel to the output, the shunt circuit coupled to the pull-up circuit and the pull-down circuit, the shunt circuit configured to receive a shunt control signal to adjust the adjustable impedance to provide linear control of an output swing at the output, the shunt control signal determined using at least an input to the pull-up circuit and the pull-down circuit.

2. The transmission line driver of claim 1, wherein the shunt circuit comprises:
a first resistor;
a second resistor coupled in series with the first resistor; and
a first device coupled between the first and second resistors, the first device configured to receive a pre-emphasis signal to enable the shunt circuit.

3. The transmission line driver of claim 2, wherein the shunt circuit comprises:
a second device coupled in parallel to the first resistor; and
a third device coupled in parallel to the second resistor,
wherein the second and third devices are configured to receive the shunt control signal,
wherein the shunt control signal is configured to control a gate voltage of the second and third devices.

4. The transmission line driver of claim 2, wherein the shunt circuit is configured to have a virtual ground at a location between the second and third devices,
wherein the first and second resistors have substantially equivalent resistance values.

5. The transmission line driver of claim 1, wherein the shunt circuit comprises:
a plurality of shunt slices coupled in parallel, each of the plurality of shunt slices having a respective adjustable impedance, the plurality of shunt slices configured to be individually selected by a respective shunt slice select signal.

6. The transmission line driver of claim 1, comprising:
a shunt calibration circuit comprising:
an amplifier having a feedback loop that connects an output of the amplifier to an input of the amplifier, the shunt control signal fed from the output of the amplifier;
a shunt slice replica that is a replica of a shunt slice, the shunt slice replica coupled to the feedback loop;
a first calibration resistor coupled to a first node of the shunt slice replica, the first calibration resistor configured to be coupled to a voltage supply; and
a second calibration resistor coupled to a second node of the shunt slice replica,
the second calibration resistor configured to be coupled to ground,
wherein the shunt slice replica is configured to be biased by the amplifier until the first and second calibration resistors reach an impedance that matches the load impedance,
wherein the shunt circuit comprises a plurality of shunt slices, and the plurality of shunt slices comprises the shunt slice.

7. The transmission line driver of claim 6, wherein an input of the amplifier is coupled to a voltage divider circuit that is configured to provide the input with a bias voltage based on a reference output swing, wherein the voltage divider circuit represents the reference output swing.

8. The transmission line driver of claim 1, wherein the pull-up circuit comprises:
a first device configured to receive a first series control signal, the first device configured to be coupled to a voltage supply; and
a second device configured to receive a first data input, the second device coupled to the first device and the output.

9. The transmission line driver of claim 8, wherein the pull-down circuit comprises:
a third device configured to receive a second series control signal, the third device configured to be coupled to ground; and
a fourth device configured to receive a second data input, the fourth device coupled to the third device and the output, wherein the pull-up circuit and the pull-down circuit are configured to provide a rail-to-rail voltage at the output based on the first and second series control signals.

10. The transmission line driver of claim 9, wherein the first and second devices are p-channel transistors and the third and fourth devices are n-channel transistors.

11. The transmission line driver of claim 9, wherein the first and third devices are configured to operate as in-situ low-dropout voltage regulators.

12. A transmission line driver with shunt slices, comprising:
a differential output configured to have a load impedance;
a pull-up circuit coupled in series with the differential output;
a pull-down circuit coupled in series with the differential output; and
a plurality of shunt slices coupled in parallel to one another, the plurality of shunt slices coupled at the differential output, each of the plurality of shunt slices comprising:
a first resistor;
a second resistor coupled in series with the first resistor;
a first device coupled in parallel to the first resistor;
a second device coupled in parallel to the second resistor; and
a third device coupled between the first and second resistors,
wherein the first device is configured to receive a control signal to adjust an impedance of the first device,
wherein the second devices is configured to receive the control signal to adjust an impedance of the second device.

13. The transmission line driver of claim 12, comprising:
a selection circuit coupled to the plurality of shunt slices, the selection circuit configured to provide shunt slice select signals to select respective ones of the plurality of shunt slices, wherein the third device of the respective ones of the plurality of shunt slices is configured to receive a respective one of the shunt slice select signals.

14. The transmission line driver of claim 12, comprising:
a first calibration circuit coupled to the pull-up circuit, the first calibration circuit configured to provide a first calibration voltage to the pull-up circuit to match an impedance of the pull-up circuit with the load impedance;
a second calibration circuit coupled to the pull-down circuit, the second calibration circuit configured to provide a second calibration voltage to the pull-down circuit to match an impedance of the pull-down circuit with the load impedance; and
a third calibration circuit coupled to the plurality of shunt slices, the third calibration circuit configured to provide the control signal.

15. The transmission line driver of claim 12, wherein a sum of the impedance of the first device, the impedance of the second device and an impedance of the third device is less than or equal to $N*R_{LOAD}$, where $R_{LOAD}$ is the load impedance, and N is a positive integer.

16. A voltage-mode driver, comprising:
a differential input;
a differential output configured to have a load impedance;
N series slices coupled in parallel to one another, the N series slices coupled to the differential output, where N is a positive integer, wherein each of the N series slices comprises:
a first adjustable impedance coupled in series with the differential output; and
a second adjustable impedance coupled in series with the differential output,
wherein the first and second adjustable impedances are adjustable based on the load impedance; and
N shunt slices coupled to the differential output, wherein each of the N shunt slices comprises:
a third adjustable impedance; and
a fourth adjustable impedance coupled in series with the third adjustable impedance,
wherein the third and fourth adjustable impedances together are coupled in parallel to the differential output; and
a selection circuit configured to select N-m shunt slices of the N shunt slices when m series slices of the N series slices are selected, where m is a positive integer that is less than N.

17. The voltage-mode driver of claim 16, comprising:
a first calibration circuit coupled to the N series slices, the first calibration circuit configured to adjust the first adjustable impedance with a first control voltage;
a second calibration circuit coupled to the N series slices, the second calibration circuit configured to adjust the second adjustable impedance with a second control voltage; and
a third calibration circuit coupled to the N shunt slices, the third calibration circuit configured to adjust the third and fourth adjustable impedances with a third control voltage.

18. The voltage-mode driver of claim 16, wherein the selection circuit comprises a plurality of pass gates coupled to respective ones of the N series slices, the selection circuit configured to provide individual selections based on a control voltage and respective ones of a plurality of enable signals.

19. The voltage-mode driver of claim 16, wherein each of the first, second, third and fourth adjustable impedances is configured to have a resistance value that is less than or equal to $N*R_{LOAD}$, where $R_{LOAD}$ is the load impedance.

20. The voltage-mode driver of claim 16, wherein the voltage-mode driver is configured to provide an output voltage swing at the differential output, wherein the output voltage swing is given by $$V_{swing} = \frac{mG}{2NG} V_{DD},$$

where $V_{swing}$ is the output voltage swing, G is a transconductance of each of the N series slices and N shunt slices, and $V_{DD}$ is a supply voltage configured to be applied to the N series slices.

* * * * *